United States Patent [19]

Kloucek

[11] Patent Number: 5,132,777
[45] Date of Patent: Jul. 21, 1992

[54] COOLED HIGH-POWER SEMICONDUCTOR DEVICE

[75] Inventor: Franz Kloucek, Neftenbach, Switzerland

[73] Assignee: Asea Brown Boveri Ltd., Baden, Switzerland

[21] Appl. No.: 645,510

[22] Filed: Jan. 24, 1991

[30] Foreign Application Priority Data

Feb. 9, 1990 [CH] Switzerland ............... 420/90

[51] Int. Cl.⁵ .................. H01K 23/02; H01K 23/42
[52] U.S. Cl. ........................... 357/81; 357/79; 357/82; 361/385; 361/386; 361/388
[58] Field of Search ............... 357/79, 81, 82; 361/385, 386, 388

[56] References Cited

U.S. PATENT DOCUMENTS

| | | | |
|---|---|---|---|
| 2,849,665 | 8/1958 | Boyer et al. | 357/82 |
| 3,397,278 | 8/1968 | Pomerantz | 174/52 |
| 3,746,947 | 7/1973 | Yamamoto et al. | 357/82 |
| 4,183,042 | 1/1980 | Novak et al. | 357/82 |
| 4,333,102 | 6/1982 | Jester et al. | 357/81 |
| 4,392,153 | 7/1983 | Glascock, II et al. | 357/82 |
| 4,402,004 | 8/1983 | Iwasaki | 357/79 |
| 4,559,580 | 12/1985 | Lutty | 361/385 |

FOREIGN PATENT DOCUMENTS

| | | |
|---|---|---|
| 13707 | 8/1980 | European Pat. Off. |
| 75036 | 3/1983 | European Pat. Off. |
| 2711776 | 9/1977 | Fed. Rep. of Germany |
| 2938096 | 4/1981 | Fed. Rep. of Germany |

*Primary Examiner*—Rolf Hille
*Assistant Examiner*—David Ostrowski
*Attorney, Agent, or Firm*—Oblon, Spivak, McClelland, Maier & Neustadt

[57] ABSTRACT

In a cooled high-power semiconductor device, the cooling is improved as a result of the fact that contact filaments (3a,b) which are arranged in brush form and which form cooling channels (11a,b) between them through which a coolant flows make contact with the semiconductor substrate (1) by a materially continuous joint.

8 Claims, 2 Drawing Sheets

COOLED HIGH-POWER SEMICONDUCTOR DEVICE

BACKGROUND OF THE INVENTION

1. Field of the invention

The present invention relates to the field of power electronics. It relates, in particular, to a cooled high-power semiconductor device comprising
(a) a disk-shaped semiconductor substrate;
(b) one contact disk which is arranged parallel to the semiconductor substrate and spaced from it on each of the two sides of the semiconductor substrate;
(c) a multiplicity of mutually parallel contact filaments which are connected, by a materially continuous joint, on one side to the associated contact disk and on the other side to the semiconductor substrate between each contact disk and the semiconductor substrate.

Such a device is known, for example, from the publication U.S. Pat. No. 4,333,102.

2. Discussion of Background

High-power semiconductor devices (diodes, thyristors, GTOs etc.) from about 200 A current level upwards are distinguished by large-area Si substrates which cannot be readily contacted by materially continuous joints (for example by solder joints) since silicon and the metallic contact parts have very different thermal expansions.

For this reason, the so-called pressure contact housing in disk form (disk-type package) is normally used for packaging such devices (in this connection see, for example, the publication U.S. Pat. No. 4,402,004). In such a disk-type package, the electrodes of the Si substrate are contacted nonpositively by pressure loading, it also being necessary to remove the heat loss of the device via these pressure contacts.

The thermal resistance of a pressure contact housing is due to the parting lines present between the parts pressed onto one another. An elaborate pressure frame is therefore necessary to clamp the devices to the heat sinks in a thermally efficient manner. In addition, the Si substrate has to be accommodated in an elaborate, hermetically sealed ceramic housing.

To improve the heat removal while neutralizing the heat expansion effects at the same time, it has now been proposed in the publication mentioned in the preamble to arrange, between the semiconductor substrate and the external heat removal disks, twisted bundles of wire which are joined by a materially continuous joint (soldered) both to the substrate and also to the respective heat removal disk.

Although an external pressure is no longer needed in this arrangement and the heat resistance with respect to the environment is reduced, the heat loss nevertheless has to be conducted completely through the bundles of wire. In addition, a hermetically sealed ceramic/metal housing continues to be necessary.

SUMMARY OF THE INVENTION

Accordingly, one object of the present invention is to provide a high-power semiconductor device whose cooling has been improved further and which is distinguished by a simplified housing.

The object is achieved in a device of the type mentioned in the preamble, wherein (d) cooling channels are present between the contact filaments, through which cooling channels a coolant flows;
(e) the terminating edge of the semiconductor substrate is provided with a passivation; and
(f) the other free faces of the semiconductor substrate are directly in contact with the coolant.

In the device according to the invention, use is therefore made of an internal cooling with which both the substrate itself and also the contact filaments and the insides of the contact disks are cooled.

This has, on the one hand, the advantage that the cooling takes place very near to the heat source and over a large area. On the other hand, because the substrate is in the coolant itself, a simple cast-on plastic insulation housing can be used. In addition, the use of a wide variety of coolants is possible.

According to a preferred exemplary embodiment of the invention, the contact filaments are composed of pieces of Cu wire which are brazed to Cu contact disks.

Further exemplary embodiments of the invention emerge from the subordinate claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
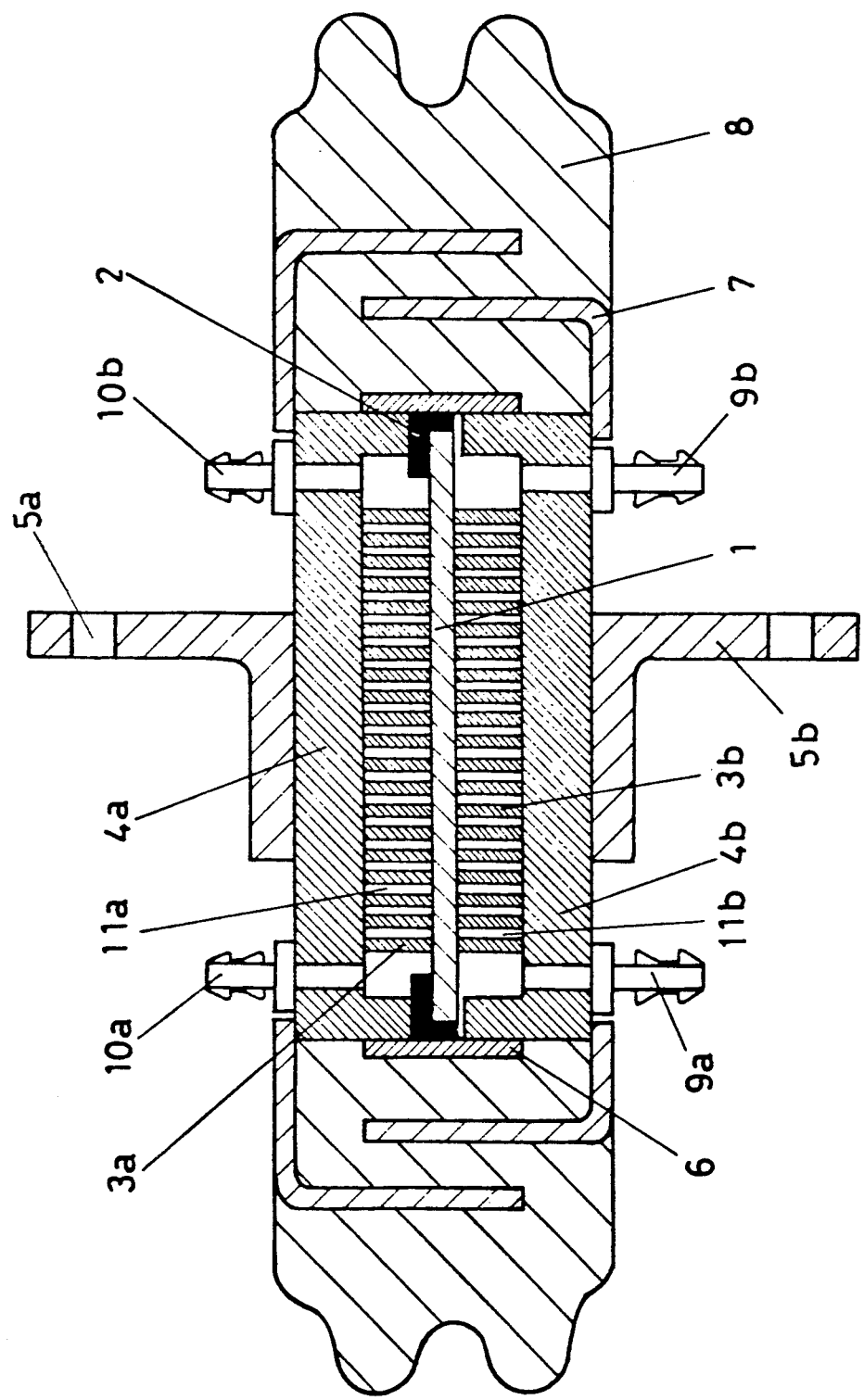
FIG. 1 shows, in cross section, a preferred embodiment of a device according to the invention.

Referring now to the drawings, wherein like reference numerals designate identical or corresponding parts throughout the two views, FIG. 1 shows a preferred exemplary embodiment of a device according to the invention. The central part of this device is a large-area, disk-shaped semiconductor substrate 1 (of Si) whose terminating edge is provided with a passivation 2.

Contact is made to the semiconductor substrate 1 by a materially continuous joint on both sides of the disk by means of a laterally yielding, brush-like structure composed of a material having high electrical and thermal conductivity, preferably copper.

This contact brush is composed of a multiplicity of single, mutually parallel contact filaments 3a,b which are each joined to an external contact disk 4a,b by a materially continuous joint. The contact disks 4a,b are parallel to the semiconductor substrate 1 and spaced from the latter.

The contact brush absorbs differences in the thermal expansion between the silicon of the semiconductor substrate 1 and the material (preferably also Cu) of the contact disks 4a,b by the filaments bending.

A coolant, preferably water, air, an oil or a hydrocarbon-containing coolant (for example freon) flows through cooling channels 11a,b formed between the contact filaments 3a,b in the immediate neighborhood of the semiconductor substrate 1, and this ensures a very efficient internal cooling.

Spacing, length, diameter and geometry of the contact filaments may at the same time be matched to the cooling requirements, and also to the surface structure of the semiconductor substrate 1. Contact can therefore be beneficially made to complex surface structures such as those encountered, for example, in GTO thyristors.

The contact filaments 3a,b and the associated contact disks 4a,b can be produced, for example, from bulk copper material by cutting operations. It is, however, more beneficial to use as contact filaments 3a,b pieces of wire which are joined by a materially continuous joint to the contact disks 4a,b as a result of brazing.

The passivation 2 is preferably provided by a layer of glass applied to the semiconductor substrate 1. In this way, it is possible for the coolant to flow directly over the semiconductor substrate 1 without impairing its high-voltage strength.

The glass layer is deposited in the form of a glass ring thermally at 700° to 900° C. or by an anodic process (in this connection see the publication U.S. Pat. No. 3,397,278) below 700° C. Glasses suitable for this purpose have to have a thermal expansion similar to Si, as is the case, for example, for Pyrex glass.

The glass passivation described makes a conventional, hermetically sealed housing unnecessary. On the contrary, the semiconductor substrate 1 is joined on both sides by a materially continuous joint—preferably as a result of soft soldering or eutectic Au-Si bonds - to the free ends of the contact filaments 3a,b and can then be provided with a plastic insulating housing 8 by potting. At the same time, a seal 6, which may be constructed, for example, in the form of a shrinkdown sleeve, is provided in order to seal the cooling circuits.

The semiconductor substrate 1 subdivides the chamber formed between the two contact disks 4a,b, with the result that two cooling circuits are produced. Two coolant connections 9a,b and 10a,b, respectively, are provided for each cooling circuit.

In order to increase the strength of the joint between the contact disks 4a,b and the insulating housing 8, anchorage elements 7 which are attached to the contact disks 4a,b may additionally be sealed in. Electrical lead-throughs for triggering the device may also be sealed in at the same time.

Epoxy resins are very suitable for the insulating housing 8 owing to their low moisture absorption. Such epoxy resins should be matched in their thermal expansion to the metal parts to be potted by electrically insulating fillers (ceramic powders).

Since the arrangement in accordance with FIG. 1 involves a pressureless contacting, current terminals 5a,b can be directly applied to the outer faces of the contact disks 4a,b.

However, for special applications, there is also the possibility of dispensing with the internal cooling and mechanically clamping, in a known manner, an air heat sink or a cooling box for liquid cooling to the external faces of the contact disks 4a,b. In this case the current terminals 5a,b are unnecessary.

Figure 2:
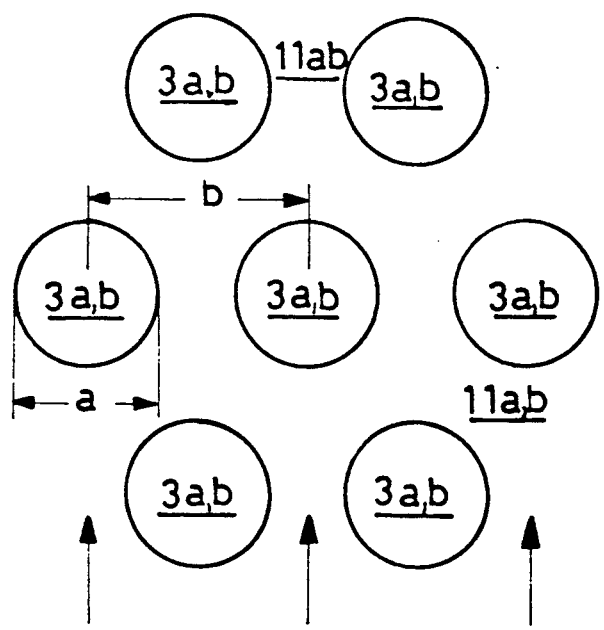
FIG. 2 shows in detail a preferred arrangement of the contact filaments for a device in accordance with FIG. 1.

As already mentioned, round pieces of wire which have a diameter a and which are hexagonally arranged (with a distance b between adjacent filaments) (FIG. 2) are preferably used for the contact filaments 3a,b.

An example will be provided below for the geometrical and physical relationships encountered in reality in a device according to the invention:

EXAMPLE

In a high-power GTO of the type CSG 2000 having a maximum continuous current of 700 A in the on-state two Cu contact brushes make contact by a materially continuous joint to the semiconductor substrate over a diameter of 60 mm. Each contact brush contains 1,450 cylindrical contact filaments having a diameter of $a = 1.0$ mm and a length of 10 mm and arranged hexagonally. The lowest center-to-center spacing of the filaments is $b = 1.5$ mm.

Metal guide plates are furthermore inserted into the contact brushes at a spacing of 17 mm in a manner such that a flow channel for the cooling medium having a cross section of about 55 mm$^2$ is produced. Such a metal plate may, for example, be beneficially inserted in spiral form. In this case, the inlet is arranged peripherally in the housing and the outlet centrally. There are two reasons for using such guide plates; on the one hand, the coolant flows uniformly over the entire cooling inner surface and, on the other hand, the cooling action is improved by the higher flow rate achieved.

With such an arrangement it is still possible to tolerate the following inlet temperature $T_{in}$ for various coolants with a power dissipation in the device of 2,100 W, a maximum junction temperature of 125° C. and a permissible coolant temperature rise of 10K:

| Medium | $T_{in}$ |
| --- | --- |
| Water: | 110° C. |
| Light oil: | 98.0° C. |
| Fluorinated hydrocarbon: | 103.8° C. |
| Air: | 75° C. |

This is in contrast to a tolerable inlet temperature of $T_{in}$ of 58.9° C. in the case of a conventional structure having pressure contact and externally applied cooling boxes.

Obviously, numerous modifications and variations of the present invention are possible in the light of the above teachings. It is therefore to be understood that within the scope of the appended claims, the invention may be practiced otherwise than as specifically described herein.

What is claimed is new and desired to be secured by Letters Patent of the United States is:

1. A cooled high-power semiconductor device comprising:
   a disk-shaped semiconductor substrate having a first side and a second side;
   first and second contact disks each arranged parallel to and spaced from said semiconductor substrate on said first and second sides, respectively;
   a plurality of mutually parallel, electrically and thermally conducting filaments which are connected, by a materially continuous joint, on one side to an associated contact disk and on another side to the semiconductor substrate, thereby establishing an electrical and thermal contact between each of said contact disks and the respective sides of said semiconductor substrate;
   wherein said filaments are spaced from one another such that cooling channels are present between said fliaments, through which cooling channels a coolant flows;

wherein a terminating edge of said semiconductor substrate is passivated by means of an isolating layer; and wherein said cooling channels are bounded on one side by the respective first and second sides of said semiconductor substrate such that said semiconductor substrate is directly in contact with said coolant.

2. The device as claimed in claim 1, wherein the contact disks (4a,b) and the contact filaments are each composed of Cu.

3. The device as claimed in claim 2, wherein the contact filaments are joined to the semiconductor substrate by soft soldering or eutectic bonding using Au.

4. The device as claimed in claim 3, wherein the contact filaments are composed of pieces of wire which are joined to the contact disks by a materially continuous joint as a result of brazing.

5. The device as claimed in claim 4, wherein metal guide plates for guiding the coolant are additionally arranged between the contact filaments.

6. The device as claimed in claim 1, wherein at least one of water, air, an oil and a hydrocarbon-containing coolant is used as coolant.

7. The device as claimed in claim 1, wherein the isolating layer comprises a glass layer.

8. The device as claimed in claim 1, wherein the arrangement comprising the semiconductor substrate, the contact filaments and the contact disks is sealed into an annular plastic insulating housing.

* * * * *